(12) United States Patent
Huo et al.

(10) Patent No.: US 9,245,831 B1
(45) Date of Patent: Jan. 26, 2016

(54) TOP-EXPOSED SEMICONDUCTOR PACKAGE AND THE MANUFACTURING METHOD

(71) Applicant: Alpha and Omega Semiconductor (Cayman) Ltd., Sunnyvale, CA (US)

(72) Inventors: Yan Huo, Shanghai (CN); Zhi Qiang Niu, Santa Clara, CA (US); Ming-Chen Lu, Shanghai (CN); Hongtao Gao, Shanghai (CN)

(73) Assignee: ALPHA AND OMEGA SEMICONDUCTOR (CAYMAN) LTD., Grand Cayman (KY)

( * ) Notice: Subject to any disclaimer, the term of this patent is extended or adjusted under 35 U.S.C. 154(b) by 0 days.

(21) Appl. No.: 14/533,244

(22) Filed: Nov. 5, 2014

(51) Int. Cl.
  *H01L 23/495* (2006.01)
  *H01L 23/31* (2006.01)
  *H01L 21/56* (2006.01)
  *H01L 21/48* (2006.01)

(52) U.S. Cl.
  CPC ...... *H01L 23/49562* (2013.01); *H01L 21/4875* (2013.01); *H01L 21/565* (2013.01); *H01L 23/3114* (2013.01); *H01L 23/49513* (2013.01)

(58) Field of Classification Search
  CPC ................. H01L 23/4954; H01L 2224/45014; H01L 2224/97; H01L 29/41766
  USPC .................. 257/735, 666, 676; 438/111, 123
  See application file for complete search history.

(56) References Cited

U.S. PATENT DOCUMENTS

| | | | | |
|---|---|---|---|---|
| 2007/0267727 A1* | 11/2007 | Hu | ..................... | H01L 23/49524 257/666 |
| 2008/0169537 A1* | 7/2008 | Kajiwara | .............. | H01L 23/495 257/666 |
| 2013/0099364 A1* | 4/2013 | Liu | ................... | H01L 23/49524 257/675 |
| 2014/0042599 A1* | 2/2014 | Wu | ................... | H01L 23/49575 257/666 |
| 2015/0001692 A1* | 1/2015 | Tsai | .................. | H01L 23/49562 257/666 |

* cited by examiner

*Primary Examiner* — S. V. Clark
(74) *Attorney, Agent, or Firm* — Chein-Hwa S. Tsao; Chen-Chi Lin

(57) ABSTRACT

A semiconductor package includes a lead frame having a die paddle and a plurality of leads connected to die paddle, where each lead has a lead surface parallel to die paddle and is a continuous extension bending upward from die paddle. A semiconductor chip is mounted on die paddle, where drain metal layer covering a first surface of chip is connected to die paddle, and source metal layer and gate metal layer are located on a second surface opposite to first surface with gate metal layer located at one corner of the second surface. A source metal plate and a gate metal plate are attached on source metal layer and gate metal layer respectively. A molding layer covers lead frame, semiconductor chip, source metal plate and gate metal plate, where lead surface, top surfaces of source metal plate and gate metal plate are exposed from top surface of molding layer.

7 Claims, 3 Drawing Sheets

TOP-EXPOSED SEMICONDUCTOR PACKAGE AND THE MANUFACTURING METHOD

FIELD OF PRESENT INVENTION

The present invention relates to a semiconductor package technology, in particular to a top-exposed semiconductor package and the manufacturing method.

BACKGROUND OF RELATED ART

A top-exposed semiconductor package of the prior art is shown in FIG. 1, which includes a semiconductor chip 2', which includes the source and gate electrodes on the top surface and a drain electrode on the bottom surface, flipped and mounted on a lead frame 1', a copper plate 3' attached on the drain electrode of the flipped chip 2' and a molding layer covering the lead frame 1' and the chip 2' with the top surface of the copper plate 3' exposed from the top surface of the molding layer. The top-exposed semiconductor package of FIG. 1 has dual-channel heat dissipation through the top surface of the copper plate 3' and the bottom surface of the lead frame 1'.

However, the surface of chip 2' is deposited with some solder balls to prevent the overflowing of the adhesive material used for mounting the chip 2' on the lead, as well as providing some spaces 6' in the lead frame 1' for preventing short-circuit between the source and the drain or the gate and the drain of the chip 2'. As such, the product cost is increased, the process is complicated and the effective contact area of the source electrode of the chip 2' is reduced. In addition, the space 6' increases the size of the entire package.

It is within this context that embodiments of the present invention arise.

BRIEF DESCRIPTION OF THE DRAWINGS

The embodiments of this invention are described in more detail with reference to the accompanying drawings. However, the accompanying drawings are for the purpose of descriptions and illustrations only and do not impose limitation to the scope of the present invention.

DESCRIPTION OF THE SPECIFIC EMBODIMENTS

A preferred embodiment of the present invention is further described below in connection with the accompanying drawings.

Figure 1:
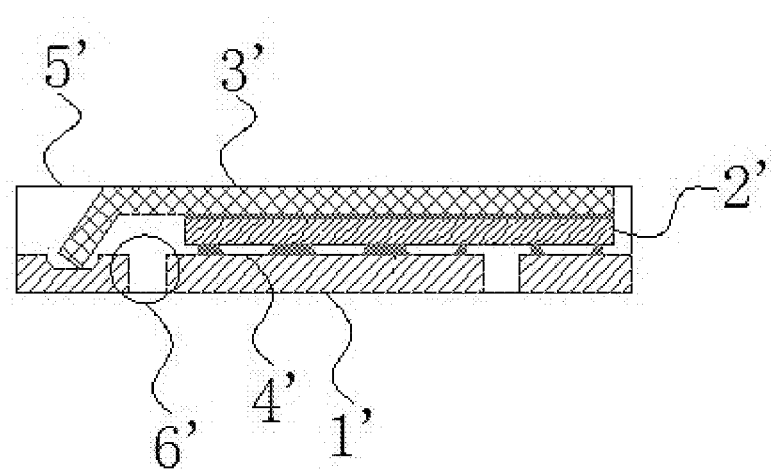
FIG. 1 illustrates a chip package structure of prior art.
Figure 2:
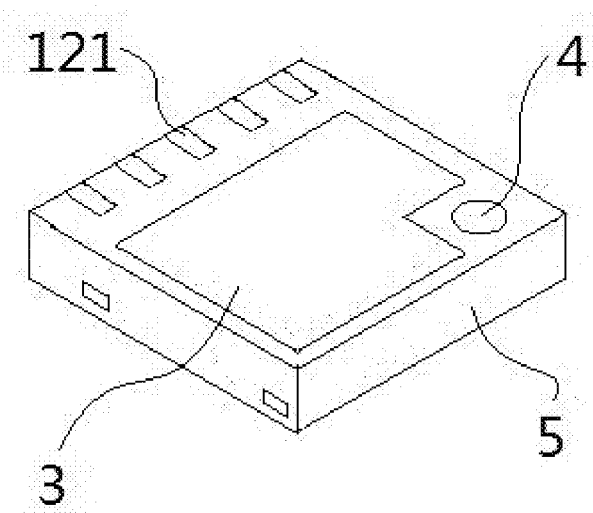
FIG. 2 illustrates the top surface of a top-exposed semiconductor package of the present invention.
Figure 3:
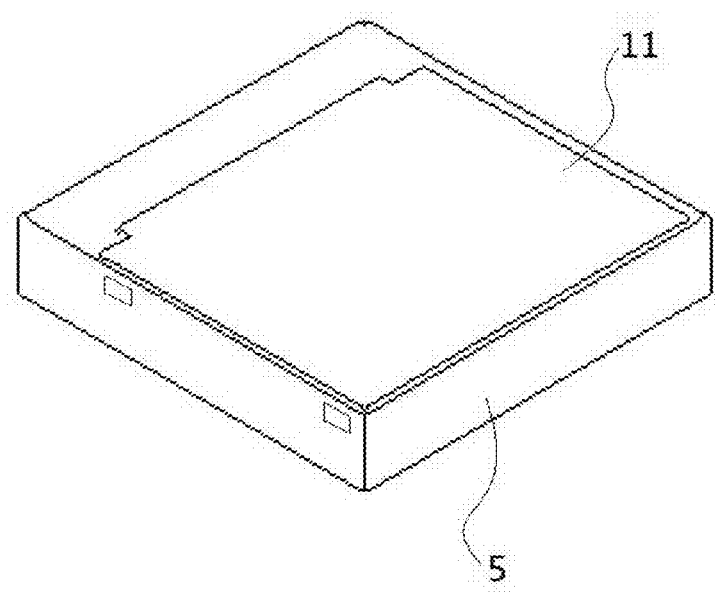
FIG. 3 illustrates the bottom surface of the top-exposed semiconductor package of FIG. 2.
Figure 4:
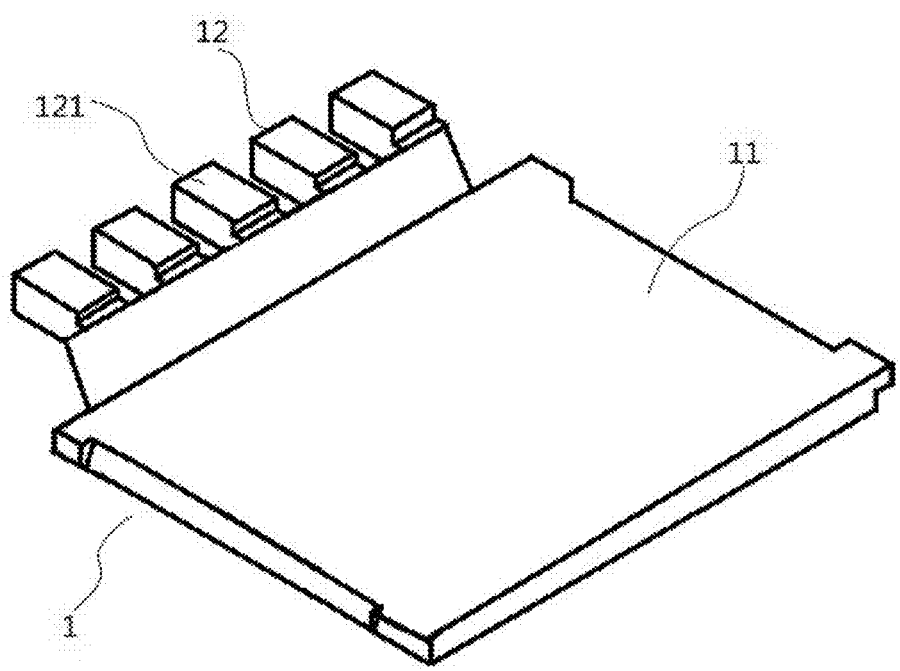
FIG. 4 is a schematic diagram of a lead frame of the present invention.

The preferred embodiment of the present invention is shown in FIGS. 2-6. As shown in FIG. 4, a lead frame 1 includes a die paddle 11 with a plurality of leads 12 connected to the die paddle 11. Each lead 12, which is a continuous extension bending upward from the die paddle 11, has a lead surface 121 parallel to the top surface of the die paddle 11.

Figure 5:
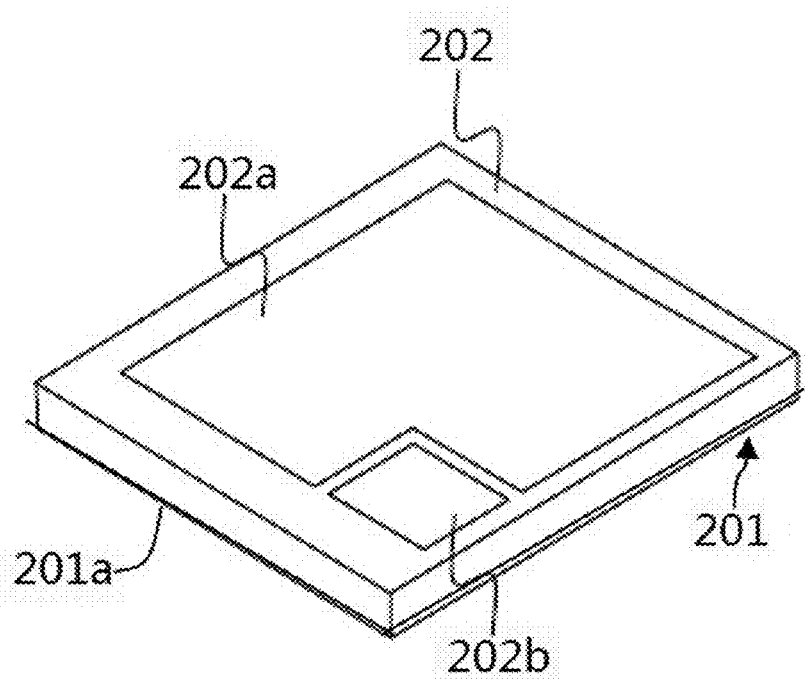
FIG. 5 is a schematic diagram of a semiconductor chip of the present invention.
Figure 6:
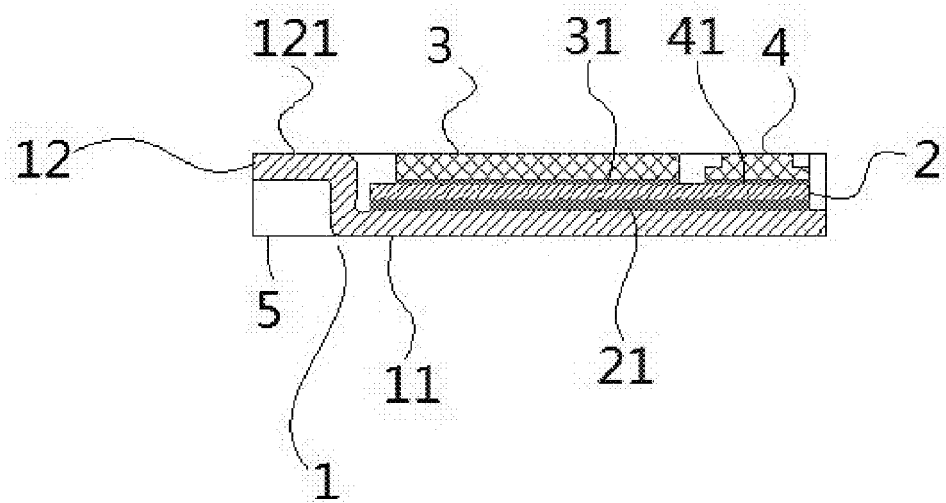
FIG. 6 is a cross-sectional view of the top-exposed semiconductor package of the present invention.

FIG. 5 is a perspective view showing a semiconductor chip 2 that includes a drain metal layer 201a attached to the drain of the chip 2 completely covering a first surface 201, for example the bottom surface, of the semiconductor chip 2, a source metal layer 202a and a gate metal layer 202b attached to the source electrode and the drain electrode respectively on a second surface 202 opposite to the first surface 201, for example the top surface, of the chip 2 with the gate metal layer 202b located at one corner of the chip 2. As shown in FIG. 6, the semiconductor chip 2 of the type depicted in FIG. 5 is mounted on the die paddle 11 of the lead frame 1 of FIG. 4, where the drain metal layer 201a is in contact with the die paddle 11. As shown in FIG. 6, the source metal plate 3 and the gate metal plate 4, which are separated from each other, are then attached on the source metal layer 202a and the gate metal layer 20b of the chip 2. The source metal plate 3, having the same geometrical shape as the source metal layer 202a, includes a top flat surface and a bottom flat surface. The gate metal plate 4 also includes a top flat surface and a bottom flat surface, where the area of each surface is smaller than that of the gate metal layer 202b. The bottom flat surface of the source metal plate 3 and the bottom flat surface of the gate metal plate 4 are completely contacted with the source metal layer 202a and the gate metal layer 202b respectively, while the top flat surfaces of the source metal plate 3 and of the gate metal plate 4 are coplanar with the lead surface 121, and all the edges of the source metal plate 3 are parallel to and do not extend outside the edges of the chip 2. In an alternative embodiment, the contact area of the source metal plate 3 is less than the contact area of the source metal layer 202a. In another alternative embodiment, the top flat surface and bottom flat surface of gate metal plate 4 have different geometry shapes, for example, the bottom flat surface contacting with the gate metal layer 202b has the same geometry shape as the gate metal layer 202b, while the top flat surface has different geometry shape and smaller surface area compared with the bottom flat surface.

In a preferred embodiment, the chip 2 is attached on the die paddle 11 of the lead frame 1 by a conductive adhesive layer 21, and the chip 2 is a power MOSFET chip or an IGBT chip. In addition, the source metal plate 3, the gate metal plate 4 are either copper plate or nickel plate and are attached on the source metal layer 202a and gate metal layer 202b of the chip 2 by the conductive adhesive layers 31 and 41 respectively. In one embodiment, the adhesive layers 21, 31 and 41 can be a conductive epoxy.

A molding layer 5 covering the lead frame 1, the chip 2, the source metal plate 3, the gate metal plate 4, where the lead surface 121, the top flat surface of the metal plate 3 and the top flat surface of the source metal plate 4 and the bottom surface of the die paddle 11 are at least partially exposed from the top and bottom surfaces of molding layer 5 respectively. FIG. 2 is a perspective view showing the lead surface 121, the top flat surface of the metal plate 3 and the top flat surface of the source metal plate 4 exposed from the top surface of the molding layer 5 and FIG. 3 is a perspective view showing the bottom surface of the die paddle 11 exposed from the bottom surface of the molding layer 5.

A method of packaging a semiconductor package of FIG. 6 is described as follows:

The process is started with a lead frame 1, which includes a die paddle 11 and a plurality of leads 12 connected to the die paddle 11. Each lead 12, which is a continuous extension bending upward from the die paddle, has a lead surface 121 parallel to the top surface of the die paddle. A semiconductor chip 2, of the type depicted on FIG. 5, is attached on the die paddle 11 by a conductive adhesive layer 21, where the drain metal layer completely covering the bottom surface of the chip is connected to the die paddle through its entire surface.

The source metal plate 3 is then attached on the source metal layer 202*a* at the top surface of the chip 2 by an conductive adhesive layer 31, and the gate metal plate 4 is attached on the gate metal layer 202*b* located at one corner at the top surface of the chip 2 by a conductive adhesive layer 41, where source metal plate 3 and gate metal plate 4 are separated from each other. The entire bottom surface of the source metal plate 3 and that of the gate metal plate 4 are connected to the source metal layer 202*a* and to the gate metal layer 202*b* respectively, while the top surfaces of the source metal plate 3 and the gate metal plate 4 are coplanar with the lead surface 121 of the leads 12, and the edges of the source metal plate 3 are parallel to the edges of the chip 2 and do not extend beyond the edge of the chip 2.

Finally, a molding layer 5 is formed covering the lead frame 1, the chip 2, the source metal plate 3 and the gate metal plate 4, where the lead surface 121, the top surface of the source metal plate 3 and that of the gate metal plate 4 are at least partially exposed from the top surface of the molding layer 5 and the bottom surface of the die paddle 11 is optionally exposed from the bottom surface of the molding layer 5. The gate metal plate 4 includes a top surface exposed from the molding layer 4 having an area smaller than the area of the bottom surface connected to the gate metal layer 202*b*.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not.

The invention claimed is:

1. A top-exposed semiconductor package comprising:
a lead frame including a die paddle and a plurality of leads bent away yet connected to the die paddle, each lead having a lead surface parallel to the die paddle and extending continuously from the die paddle to the lead surface;
a semiconductor chip mounted on the die paddle of the lead frame, wherein a drain metal layer covering an entire first surface of the semiconductor chip is connected to the die paddle, a source metal layer and a gate metal layer are located on a second surface opposite to the first surface with the gate metal layer located at one corner of the semiconductor chip;
a source metal plate and a gate metal plate separated from each other, wherein entire bottom surfaces of the source metal plate and the gate metal plate are connected to the source metal layer and the gate metal layer on the semiconductor chip respectively, and top surfaces of the source metal plate and the gate metal plate are coplanar with the lead surface, wherein all edges of the source metal plate are parallel to and within edges of the semiconductor chip; and
a molding layer covering the lead frame, the semiconductor chip, the source metal plate and the gate metal plate, wherein the lead surface, the top surfaces of the source metal plate and the gate metal plate are at least partially exposed from a top surface of the molding layer.

2. The semiconductor package of claim 1, wherein the semiconductor chip is attached on the lead frame by an epoxy.

3. The semiconductor package of claim 1, wherein the semiconductor chip is a power MOSFET chip or an IGBT chip.

4. The semiconductor package of claim 1, wherein the source metal plate, the gate metal plate are attached on the source metal layer and the gate metal layer of the semiconductor chip respectively by epoxy.

5. The semiconductor package of claim 1, wherein the source metal plate and the gate metal plate are copper plates or nickel plates.

6. A method for manufacturing a semiconductor package, the method comprising the steps of:
providing a lead frame including a die paddle and a plurality of leads connected to the die paddle bent away from the die paddle, each lead having a lead surface parallel to the die paddle and extending continuously from the die paddle to the lead surface;
attaching a semiconductor chip on the die paddle, wherein a drain metal layer covering an entire first surface of the semiconductor chip is connected to the die paddle;
attaching a source metal plate and a gate metal plate atop a source metal layer and a gate metal layer of the semiconductor chip respectively, wherein the source metal layer and the gate metal layer are located on a second surface opposite to the first surface of the semiconductor chip, with the gate metal layer located at one corner of the second surface of the semiconductor chip, wherein entire bottom surfaces of the source metal plate and of the gate metal plate are connected to the source metal layer and the gate metal layer of the semiconductor chip respectively, and top surfaces of the source metal plate and the gate metal plate are coplanar with the lead surface with edges of the source metal plate being parallel to and not extending beyond edges of the semiconductor chip; and
forming a molding layer covering the lead frame, the semiconductor chip, the source metal plate and the gate metal plate, wherein the lead surface, the top surfaces of the source metal plate and the gate metal plate are at least partially exposed from the molding layer.

7. The method of claim 6, wherein the top surface of the gate metal plate exposed from the molding layer has an area smaller than the area of the bottom surface connected to the gate metal layer.

* * * * *